US011276584B2

(12) United States Patent
Tsunetomo et al.

(10) Patent No.: US 11,276,584 B2
(45) Date of Patent: Mar. 15, 2022

(54) SUBSTRATE WITH GLASS SHEET, RESIN LAYER AND THROUGH-GLASS VIA

(71) Applicant: Nippon Sheet Glass Company, Limited, Tokyo (JP)

(72) Inventors: Keiji Tsunetomo, Kanagawa (JP); Hideki Hashizume, Tokyo (JP); Kazuya Ohkawa, Kanagawa (JP)

(73) Assignee: NIPPON SHEET GLASS COMPANY, LIMITED, Tokyo (JP)

( * ) Notice: Subject to any disclaimer, the term of this patent is extended or adjusted under 35 U.S.C. 154(b) by 231 days.

(21) Appl. No.: 16/533,218

(22) Filed: Aug. 6, 2019

(65) Prior Publication Data
US 2019/0362987 A1  Nov. 28, 2019

Related U.S. Application Data

(63) Continuation of application No. 15/519,392, filed as application No. PCT/JP2015/004958 on Sep. 29, 2015, now Pat. No. 10,418,256.

(30) Foreign Application Priority Data

Oct. 22, 2014 (JP) ................................. 2014-215247

(51) Int. Cl.
*B23P 19/00* (2006.01)
*H01L 21/48* (2006.01)
(Continued)

(52) U.S. Cl.
CPC .......... *H01L 21/486* (2013.01); *B23K 1/0016* (2013.01); *B23K 26/0006* (2013.01);
(Continued)

(58) Field of Classification Search
CPC . H01L 21/486; H01L 23/15; H01L 23/49822; B32B 15/08; B32B 17/10018;
(Continued)

(56) References Cited

U.S. PATENT DOCUMENTS 7,772,118 B2   8/2010 Yamano
9,017,932 B2*  4/2015 Imai ................... H01L 21/6836
                                                       430/325
2010/0068453 A1* 3/2010 Imai ...................... G03F 7/2022
                                                       428/131

FOREIGN PATENT DOCUMENTS

JP     S54126215      10/1979
JP     2000061667      2/2000
(Continued)

OTHER PUBLICATIONS

Takashi Yoshinaga et al., "Trends in R&D in TSV Technology for 3D LSI Packaging," Science & Technology Trends, Apr. 2010 [Oct. 2010], p. 23-34 [p. 26-39], No. 109 [Quarterly Review No. 37] (both Japanese and English versions included).
(Continued)

*Primary Examiner* — Thiem D Phan
(74) *Attorney, Agent, or Firm* — Hamre, Schumann, Mueller & Larson, P.C.

(57) ABSTRACT

A method for producing a glass substrate according to the present invention includes the steps of: (I) forming a through hole (11) in a glass sheet (10); (II) forming a resin layer (20) on a first principal surface of the glass sheet (10) using a resin composition sensitive to light having a predetermined wavelength $\lambda_1$; (III) photoexposing an area of the resin layer (20) that covers the through hole (11) by irradiating the area with light U having the wavelength $\lambda_1$ and applied from the direction of a second principal surface of the glass sheet (10); and (IV) forming a through-resin hole (21) by removing the area photoexposed in the step (III). The glass sheet (10) protects the resin layer (20) from the light U so as to prevent the resin layer (20) from being photoexposed by beams of the light U that are incident on the second principal surface of the glass sheet (10) in the step (III).

11 Claims, 5 Drawing Sheets

(51) Int. Cl.
- C03C 15/00 (2006.01)
- H05K 3/00 (2006.01)
- H05K 3/42 (2006.01)
- B23K 1/00 (2006.01)
- B23K 26/00 (2014.01)
- C03C 3/085 (2006.01)
- C03C 3/087 (2006.01)
- C03C 3/089 (2006.01)
- C03C 17/36 (2006.01)
- C03C 23/00 (2006.01)
- B23K 26/0622 (2014.01)
- B23K 26/53 (2014.01)
- H01L 23/498 (2006.01)
- B32B 17/10 (2006.01)
- C03C 17/28 (2006.01)
- H05K 1/02 (2006.01)
- H05K 1/03 (2006.01)
- B23K 103/00 (2006.01)
- B23K 101/42 (2006.01)
- H01L 23/15 (2006.01)

(52) U.S. Cl.
CPC .......... *B23K 26/0622* (2015.10); *B23K 26/53* (2015.10); *B32B 17/10* (2013.01); *C03C 3/085* (2013.01); *C03C 3/087* (2013.01); *C03C 3/089* (2013.01); *C03C 15/00* (2013.01); *C03C 17/28* (2013.01); *C03C 17/36* (2013.01); *C03C 23/0025* (2013.01); *H01L 23/49827* (2013.01); *H05K 3/0082* (2013.01); *H05K 3/426* (2013.01); *B23K 2101/42* (2018.08); *B23K 2103/42* (2018.08); *B23K 2103/54* (2018.08); *H01L 23/15* (2013.01); *H01L 23/49822* (2013.01); *H01L 2924/0002* (2013.01); *H05K 1/0274* (2013.01); *H05K 1/0306* (2013.01); *H05K 2203/107* (2013.01); *H05K 2203/1581* (2013.01); *Y10T 29/49165* (2015.01); *Y10T 29/5313* (2015.01)

(58) Field of Classification Search
CPC .... B32B 27/38; H05K 1/0274; H05K 1/0306; H05K 2203/107; H05K 3/4644; Y10T 29/49165; Y10T 29/5313
USPC ......... 29/729, 745, 787, 795, 825, 829, 846, 29/848, 852
See application file for complete search history.

(56) References Cited

FOREIGN PATENT DOCUMENTS

| | | |
|---|---|---|
| JP | 2001105398 | 4/2001 |
| JP | 2003071933 | 3/2003 |
| JP | 2008156200 | 7/2008 |
| JP | 2011178642 | 9/2011 |
| TW | 201351573 | 12/2013 |
| TW | 201407280 | 2/2014 |

OTHER PUBLICATIONS

International Search Report for PCT/JP2015/004958, dated Jan. 12, 2016, 3 pages including English translation.

* cited by examiner

SUBSTRATE WITH GLASS SHEET, RESIN LAYER AND THROUGH-GLASS VIA

TECHNICAL FIELD

The present invention relates to a method for producing a glass substrate and a glass sheet for use in the method for producing a glass substrate.

BACKGROUND ART

A known example of conventional mounting techniques for large-scale integration (LSI) is one that uses through silicon via (TSV) technology as described in Non Patent Literature 1. Silicon substrates having through silicon vias are widely used, for example, as interposers. An interposer is a substrate that interconnects a pair of circuit boards differing in routing design rule and in terminal pitch such as a pair of an integrated circuit (IC) and a printed board.

The TSV technology unfortunately requires high cost because this technology uses a silicon substrate, which is expensive, and because it involves, due to the semiconductivity of silicon, an insulation treatment performed before the formation of through holes in the silicon substrate. In terms of, for example, cost reduction of interposers, attention has been given to glass substrates with through glass vias (TGVs) which are produced by forming through glass vias in a glass substrate which is inexpensive.

The TGV technology involves the formation of through holes in a glass substrate. A known example of the technique for forming through holes in a glass substrate is one in which, as described in Patent Literature 1, the formation of through holes is accomplished by irradiation with a pulsed YAG laser. Additionally, Patent Literature 2 describes a method for forming minute holes in a photosensitive glass substrate. In the method described in Patent Literature 2, a photomask is placed over a predefined region of the photosensitive glass substrate, and the photosensitive glass substrate is irradiated with ultraviolet light to form a latent image. The photosensitive glass substrate is then heated to crystallize the latent image. Next, a processing target hole smaller than the latent image is formed by laser light at the center of the area where the latent image lies. This is followed by etching using hydrofluoric acid. The crystallized area is thus selectively etched, with the result that a hole is formed. Patent Literature 3 describes a method for perforating a glass sheet from both sides of the glass sheet using a pair of upper and lower coaxial core drills opposed across the glass sheet.

CITATION LIST

Patent Literature

Patent Literature 1: JP 2000-061667 A
Patent Literature 2: JP 2001-105398 A
Patent Literature 3: JP 54-126215 A

Non Patent Literature

Non Patent Literature 1: Takashi Yoshinaga and Minoru Nomura, "Trends of Research and Development of TSV Technology for Three-Dimensional LSI Packaging", Science and Technology Trends, National Institute of Science and Technology Policy, April 2010, No. 109, pp. 23-34.

SUMMARY OF INVENTION

Technical Problem

Glass substrates having through holes formed therein have the disadvantage of having low mechanical strength and being difficult to handle during processing thereof.

It is therefore an object of the present invention to produce a glass substrate having high mechanical strength despite having through holes formed therein.

Solution to Problem

The present invention provides a method for producing a glass substrate, including the steps of
(I) forming a through hole in a glass sheet;
(II) forming a resin layer on a first principal surface of the glass sheet using a resin composition so as to cover the through hole, the resin composition being sensitive to light having a predetermined wavelength $\lambda_1$ within a wavelength range of 120 nm to 300 nm;
(III) photoexposing an area of the resin layer that covers the through hole by irradiating the area with light U having the wavelength $\lambda_1$ and applied from the direction of a second principal surface of the glass sheet; and
(IV) forming a through-resin hole extending through the resin layer by removing the area photoexposed in the step (III).

The glass sheet has a light transmittance of 1% or less at the wavelength $\lambda_1$ and protects the resin layer from the light U so as to prevent the resin layer from being photoexposed by beams of the light U that are incident on the second principal surface of the glass sheet in the step (III).

The present invention also provides a glass sheet for use in the above method for producing a glass substrate in which the step (I) includes the steps of; (I-a) irradiating an area of the glass sheet with a laser beam to form a modified portion in the area irradiated with the laser beam; and (I-b) forming the through hole in the glass sheet by etching at least the modified portion using an etchant that etches the modified portion at an etching rate higher than an etching rate at which the etchant etches an area of the glass sheet where the modified portion is not formed, the laser beam having a predetermined wavelength $\lambda_2$ within a wavelength range of 250 nm to 535 nm.

The glass sheet has a light transmittance of 1% or less at the wavelength $\lambda_1$ and has a light absorption coefficient of 50 $cm^{-1}$ or less at the wavelength $\lambda_2$.

When a resin layer is formed on a first principal surface of the glass sheet using the resin composition and is then irradiated with the light U having the wavelength $\lambda_1$ and applied from the direction of a second principal surface of the glass sheet, the glass sheet is capable of protecting the resin layer from the light U so as to prevent the resin layer from being photoexposed by beams of the light U that are incident on the second principal surface of the glass sheet.

Advantageous Effects of Invention

In the present invention, the resin layer is formed on the first principal surface of the glass sheet having a through hole formed therein, so that the glass substrate produced has high mechanical strength. The glass substrate produced by the method according to the present invention is therefore easy to handle during processing thereof.

DESCRIPTION OF EMBODIMENTS

Figure 1:
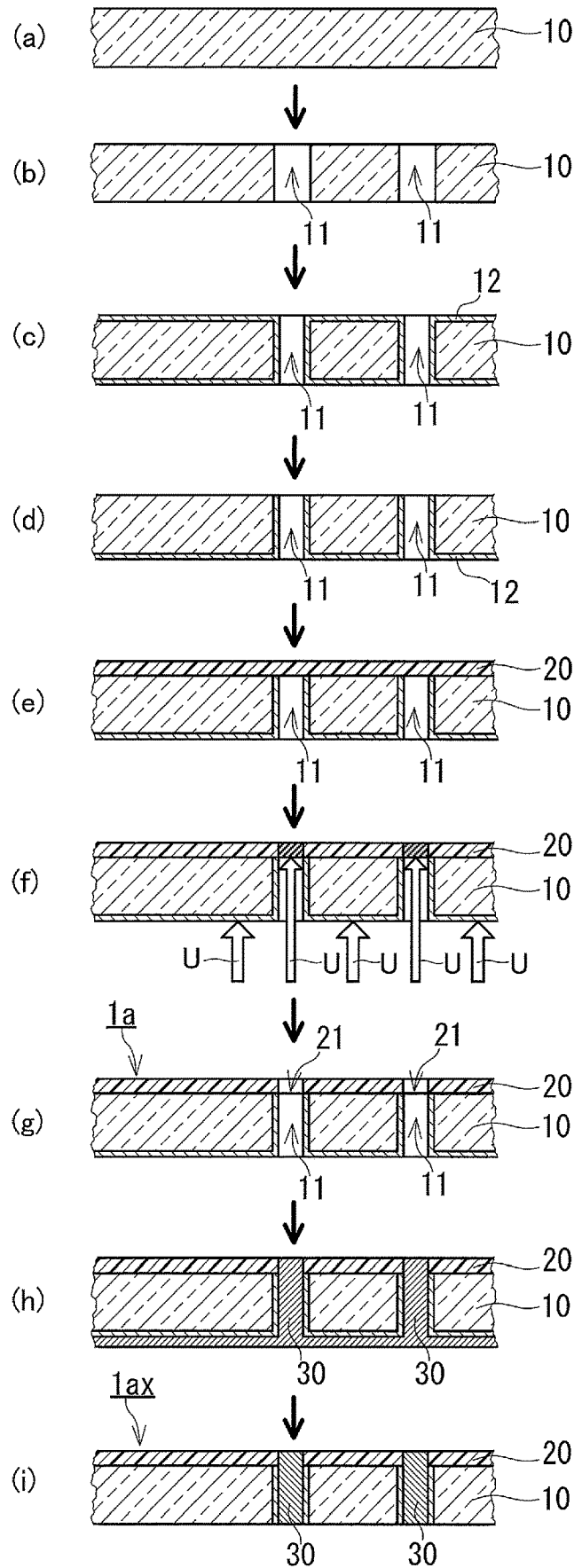
FIG. 1 shows cross-sectional views illustrating the steps of the method for producing a glass substrate according to the first embodiment.

Hereinafter, embodiments of the present invention will be described with reference to the drawings. The following description relates to examples of the present invention, and the present invention is not limited by these examples.

First Embodiment

The method for producing a glass substrate according to the first embodiment includes steps (I), (II), (III), and (IV). For the step (I), a glass sheet 10 is prepared as shown in (a) of FIG. 1. As shown in (b) of FIG. 1, the step (I) is a step of forming through holes 11 in the glass sheet 10. As shown in (e) of FIG. 1, the step (II) is a step of forming a resin layer 20 on a first principal surface of the glass sheet 10 using a resin composition so as to cover the through holes 11, the resin composition being sensitive to light having a predetermined wavelength $\lambda_1$ within a wavelength range of 120 nm to 300 nm. As shown in (f) of FIG. 1, the step (III) is a step of photoexposing areas of the resin layer 20 that cover the through holes by irradiating the areas with light U having the wavelength $\lambda_1$ and applied from the direction of a second principal surface of the glass sheet 10. As shown in (g) of FIG. 1, the step (IV) is a step of forming through-resin holes 21 extending through the resin layer 20 by removing the areas photoexposed in the step (III).

The glass sheet 10 prepared for the step (I) has a light transmittance of 1% or less at the wavelength $\lambda_1$. The light transmittance of the glass sheet 10 at the wavelength $\lambda_1$ is preferably as low as possible. The glass sheet 10 protects the resin layer 20 from the light U so as to prevent the resin layer 20 from being photoexposed by beams of the light U that are incident on the second principal surface of the glass sheet 10 in the step (III). That is, when the resin layer 20 is formed on the first principal surface of the glass sheet 10 using a resin composition sensitive to light having the wavelength $\lambda_1$ and is then irradiated with the light U having the wavelength $\lambda_1$ and applied from the direction of the second principal surface of the glass sheet 10, the glass sheet 10 is capable of protecting the resin layer 20 from the light U so as to prevent the resin layer 20 from being photoexposed by beams of the light U that are incident on the second principal surface of the glass sheet 10. The glass sheet 10 is not particularly limited, as long as it has the properties as described above. As the glass forming the glass sheet 10 there is preferably used borosilicate glass, aluminosilicate glass, soda-lime glass, titanium-containing silicate glass, or alkali-free glass. The properties as described above may be imparted to the glass sheet 10 by a surface treatment such as coating formation.

When the glass sheet 10 is formed of borosilicate glass, #7059 or Pyrex (registered trademark) available from Corning Incorporated can be used.

When the glass sheet 10 is formed of aluminosilicate glass, a glass composition having the following composition may be used.

A glass composition containing, in mass %:
58 to 66% $SiO_2$;
13 to 19% $Al_2O_3$;
3 to 4.5% $Li_2O$;
6 to 13% $Na_2O$;
0 to 5% $K_2O$;
10 to 18% $R_2O$, where $R_2O=Li_2O+Na_2O+K_2O$;
0 to 3.5% $MgO$;
1 to 7% $CaO$;
0 to 2% $SrO$;
0 to 2% $BaO$;
2 to 10% $RO$, where $RO=MgO+CaO+SrO+BaO$;
0 to 2% $TiO_2$;
0 to 2% $CeO_2$;
0 to 2% $Fe_2O_3$;
0 to 1% $MnO$; and
0.05 to 0.5% $SO_3$,
wherein $TiO_2+CeO_2+Fe_2O_3+MnO=0.01$ to 3%.

A glass composition having the following composition may also be used.

A glass composition containing, in mass %:
60 to 70% $SiO_2$;
5 to 20% $Al_2O_3$;
5 to 25% $Li_2O+Na_2O+K_2O$;
0 to 1% $Li_2O$;
3 to 18% $Na_2O$;
0 to 9% $K_2O$;
5 to 20% $MgO+CaO+SrO+BaO$;
0 to 10% $MgO$;
1 to 15% $CaO$;
0 to 4.5% $SrO$;
0 to 1% $BaO$;
0 to 1% $TiO_2$; and
0 to 1% $ZrO_2$.

A glass composition having the following composition may also be used.

A glass composition containing, in mass %:
59 to 68% $SiO_2$;
9.5 to 15% $Al_2O_3$;
0 to 1% $Li_2O$;
3 to 18% $Na_2O$;
0 to 3.5% $Kc_2O$;
0 to 15% $MgO$;
1 to 15% $CaO$;
0 to 4.5% $SrO$;
0 to 1% $BaO$;
0 to 2% $TiO_2$; and
1 to 10% $ZrO_2$.

The following glass composition can also be used.
A glass composition containing, in mass %:
50 to 70% $SiO_2$;
14 to 28% $Al_2O_3$;
1 to 5% $Na_2O$;
1 to 13% $MgO$; and
0 to 14% $ZnO$.

The following glass composition may also be used.

A glass composition containing, in mass %:
56 to 70% $SiO_2$;
7 to 17% $Al_2O_3$;
4 to 8% $Li_2O$;
1 to 11% MgO;
4 to 12% ZnO;
14 to 23% $Li_2O+MgO+ZnO$;
0 to 9% $B_2O_3$;
0 to 3% CaO+BaO; and
0 to 2% $TiO_2$.

When the glass sheet 10 is formed of soda-lime glass, for example, any of glass compositions widely used for glass sheets can be employed.

When the glass sheet 10 is formed of titanium-containing silicate glass, for example, the light absorption coefficient of the glass sheet 10 at a predetermined wavelength $\Delta_2$ within a wavelength range of 250 nm to 535 nm can be increased to 1 $cm^{-1}$ or more by increasing the $TiO_2$ content to 5 mol % or more, and the light absorption coefficient of the glass sheet 10 at the wavelength $\lambda_2$ can be increased to 4 $cm^{-1}$ or more by increasing the $TiO_2$ content to 10 mol % or more. The glass sheet 10 may further contain, if necessary, at least one oxide of a metal selected from Bi, W, Mo, Ce, Co, Fe, Mn, Cr, and V. Such a metal oxide is capable of functioning as a coloring component to increase the absorption coefficient of the glass sheet 10.

When the glass sheet 10 is formed of titanium-containing silicate glass, for example, the following glass composition can be used.

A glass composition in which the following relationships are satisfied:
$50 \leq (SiO_2+B_2O_3) \leq 79$ mol %;
$5 \leq (Al_2O_3+TiO_2) \leq 25$ mol %;
$5 \leq (Li_2O+Na_2O+K_2O+Rb_2O+Cs_2O+MgO+CaO+SrO+BaO) \leq 25$ mol %; and
$5 \leq TiO_2 \leq 25$ mol %.

For the above titanium-containing silicate glass, it is preferable that the relationship $(Al_2O_3+TiO_2)/(Li_2O+Na_2O+K_2O+Rb_2O+Cs_2O+MgO+CaO+SrO+BaO) \leq 0.9$ be satisfied.

For the above titanium-containing silicate glass, it is preferable that the following relationships be satisfied:
$70 \leq (SiO_2+B_2O_3) \leq 79$ mol %;
$10 \leq TiO_2 \leq 15$ mol %; and
$10 \leq Na_2O \leq 15$ mol %.

As the alkali-free glass there can be used, for example, the following glass composition.

A glass composition in which the following relationships are satisfied:
$45 \leq (SiO_2+B_2O_3) \leq 80$ mol %;
$7 \leq Al_2O_3 \leq 15$ mol %;
$0 \leq TiO_2 \leq 5$ mol %; and
$2 \leq (MgO+CaO+SrO+BaO) \leq 20$ mol %,
the glass composition being substantially free of any alkali metal oxide.

The thickness of the glass sheet 10 is not particularly limited. When the glass substrate produced is to be used as an interposer, the thickness of the glass sheet 10 is, for example, 0.05 to 1 mm.

The method for forming the through holes 11 in the glass sheet 10 in the step (I) is not particularly limited. For example, known methods such as those described in Patent Literature 1 to 3 can be employed. In terms of reducing the production cost and of making the through holes 11 uniform in shape by preventing deformation of the glass sheet 10 which could occur in the vicinity of the through holes 11 during formation of the through holes 11, a method described below is preferably used in the step (I) to form the through holes 11 in the glass sheet 10. Specifically, the step (I) includes steps (I-a) and (I-b). For these steps, techniques described in JP 2008-156200 A can be employed.

The step (I-a) is a step of irradiating areas of the glass sheet 10 with laser beams to form modified portions in the areas irradiated with the laser beams. The laser beams have the predetermined wavelength $\lambda_2$ within the wavelength range of 250 nm to 535 nm. The step (I-b) is a step of forming the through holes 11 in the glass sheet 10 by etching at least the modified portions using an etchant that etches the modified portions at an etching rate higher than an etching rate at which the etchant etches areas of the glass sheet 10 where the modified portions are not formed.

In the step (I-a), for example, pulsed laser beams having the wavelength $\lambda_2$ are focused by a lens, and the glass sheet 10 is irradiated with the focused laser beams. The pulse width of the pulsed laser beams is not particularly limited. In terms of reducing the cost of the laser irradiation apparatus used and increasing the peak value of the laser beams L to a certain value or higher to achieve good processing performance, the pulse width is, for example, 1 ns (nanosecond(s)) to 200 ns, preferably 1 ns to 100 ns, and more preferably 5 ns to 50 ns.

The pulsed laser beams are, for example, harmonic beams from a Nd:YAG laser, harmonic beams from a Nd:YVO4 laser, or harmonic beams from a Nd:YLF laser. In this case, the harmonic beams are, for example, the second harmonic beams, third harmonic beams, or fourth harmonic beams. The wavelength of the second harmonic beams is around 532 nm to 535 nm, the wavelength of the third harmonic beams is around 355 nm to 357 nm, and the wavelength of the fourth harmonic beams is around 266 nm to 268 nm. The use of such pulsed laser beams allows cost-effective formation of the modified portions in the glass sheet 10.

The wavelength $\lambda_2$ of the pulsed laser beams is, for example, 535 nm or less, preferably 360 nm or less, and more preferably 350 nm to 360 nm, in terms of reducing the spot size of the pulsed laser beams to a predetermined value or less to allow the through holes 11 to be formed as minute holes in the glass sheet 10. It is desirable that the following relationship be satisfied: wavelength $\lambda_1$ < wavelength $\lambda_2$.

The energy possessed by the pulsed laser beams is not particularly limited. The energy is preferably adjusted depending on the material of the glass sheet 10 or the size of the modified portions to be formed in the glass sheet 10. The energy possessed by the pulsed laser beams is, for example, 5 µJ/pulse to 100 µJ/pulse. Increasing the energy of the pulsed laser beams leads to a corresponding increase in the length of the modified portions. The beam quality $M^2$ of the pulsed laser beams is, for example, 2 or less. In this case, the through holes 11 can easily be formed as minute holes in the glass sheet 10.

The light absorption coefficient of the glass sheet 10 at the wavelength $\lambda_2$ is, for example, 50 $cm^{-1}$ or less and preferably 0.1 $cm^{-1}$ to 20 $cm^{-1}$. In this case, the energy of the pulsed laser beams is less likely to be absorbed in the vicinity of the surface of the glass sheet 10, so that the modified portions are more likely to be formed within the glass sheet 10. It should be understood that even if the absorption coefficient of the glass sheet 10 at the wavelength $\lambda_2$ is less than 0.1 $cm^{-1}$, the modified portions can be formed within the glass sheet 10. A glass having a light absorption coefficient of 50 $cm^{-1}$ or less at the wavelength $\lambda_2$ can be selected from known glasses.

The absorption coefficient can be calculated by measuring the transmittance and reflectance of a sample having a thickness d (e.g., d=about 0.1 cm). First, the transmittance T (%) and the reflectance R (%) at an incident angle of 12° are measured for the sample having a thickness d (cm). The transmittance T and reflectance R can be measured, for example, using UV-3100, a spectrophotometer manufactured by Shimadzu Corporation. The absorption coefficient α of the glass can be calculated from the measured values using the following equation.

$$\alpha = \ln((100-R)/T)/d$$

The use of the foregoing method eliminates the need for the glass sheet 10 to be formed of a photosensitive glass. This enables formation of modified portions in a wide variety of glasses. That is, the foregoing method can be employed even when the glass sheet 10 is formed of a glass substantially free of gold or silver.

It is preferable for the glass sheet 10 to have a Young's modulus of 70 GPa or more, in terms of preventing the upper and lower surfaces of the glass sheet 10 from being cracked by laser irradiation of the glass sheet 10.

The focal length F (mm) of the lens is, for example, 50 mm to 500 mm and preferably 100 mm to 200 mm.

The beam diameter D (mm) of the pulsed laser is, for example, 1 mm to 40 mm and preferably 3 mm to 20 mm. The beam diameter D as defined herein refers to the diameter of the pulsed laser beam incident on the lens, and refers to the diameter at which the beam intensity drops to $[1/e^2]$ times the beam intensity at the center of the beam.

A value obtained by dividing the focal length F by the beam diameter D, i.e., the value of [F/D], is 7 or more, preferably 7 or more and 40 or less, and more preferably 10 or more and 20 or less. This value is associated with the degree of focusing of laser beams with which the glass is to be irradiated. When the F/D is 7 or more, the generation of an excessively high laser power in the vicinity of the beam waist can be prevented so that the occurrence of cracks inside the glass sheet 10 can be prevented.

It is unnecessary, before irradiation of the glass sheet 10 with the pulsed laser beams, to subject the glass sheet 10 to a pretreatment such as formation of a film for promoting the absorption of the pulsed laser beams. Depending on the situation, such a pretreatment may be carried out.

The modified portions are formed in the areas of the glass sheet 10 that have been irradiated with the pulsed laser beams. The modified portions can be distinguished from the rest of the glass sheet 10 typically by observation with an optical microscope. The modified portions include: portions with defects such as E' center and non-bridging oxygen which have resulted from photochemical reaction induced by laser irradiation; and portions with a sparse glass structure generated at a high temperature due to rapid heating during laser irradiation and maintained due to rapid cooling after laser irradiation. The modified portions are easier to etch with a predetermined etchant than the areas of the glass sheet 10 other than the modified portions.

In the step (I-a), for example, the glass sheet 10 is irradiated with the laser beams that are focused on points within the glass sheet 10. The modified portions are formed to facilitate the formation of the through holes 11 in the glass sheet 10 in the step (I-b). To this end, the laser beams are focused, for example, on points at or in the vicinity of the thickness center of the glass sheet 10 when applied to the glass sheet 10. The laser beams may be focused on points outside the glass sheet 10 when applied to the glass sheet 10, as long as the modified portions can be formed in the glass sheet 10. For example, when applied to the glass sheet 10, the laser beams may be focused on points at a predetermined distance (e.g., 1.0 mm) from the surface of the glass sheet 10 on which the laser beams are incident, or the laser beams may be focused on points at a predetermined distance (e.g., 1.0 mm) from the surface of the glass sheet 10 opposite to that on which the laser beams are incident. That is, as long as the modified portions can be formed in the glass sheet 10, (i) the laser beams may be focused on points within a distance of 1.0 mm from the laser beam-incident surface of the glass sheet 10 in a direction opposite to the traveling direction of the laser beams (the points including those on the laser beam-incident surface of the glass sheet 10), (ii) the laser beams may be focused on points within a distance of 1.0 mm from the surface of the glass sheet 10 opposite to the laser beam-incident surface in the direction in which the laser beams having passed through the glass sheet 10 travel (the points including those on the surface of the glass sheet 10 opposite to the laser beam-incident surface), or (iii) the laser beams may be focused on points within the glass sheet 10.

The size of the modified portions formed in the glass sheet 10 varies depending on, for example, the beam diameter D of the laser beams incident on the lens, the focal length F of the lens, the absorption coefficient of the glass sheet 10, and the power of the pulsed laser. Adjusting these parameters makes it possible, for example, to form the modified portions in the shape of a cylinder having a diameter of 10 μm or less and having a length of 100 μm or more in the thickness direction of the glass sheet 10.

Examples of the conditions employed in the step (I-a) are listed in Table 1.

TABLE 1

| | Conditions | Range |
| --- | --- | --- |
| | Absorption coefficient of glass [cm$^{-1}$] | 0.1 to 20 |
| Laser beam L | Pulse width [ns] | 5 to 50 |
| | Wavelength [nm] | 350 to 360 |
| | Beam diameter D [mm] | 3 to 20 |
| | Energy [μJ/pulse] | 5 to 100 |
| | Focal length of lens F [mm] | 100 to 200 |

Next, the step (I-b) will be described. The step (I-b) uses an etchant that etches the modified portions at an etching rate higher than an etching rate at which the etchant etches areas of the glass sheet 10 where the modified portions are not formed. As such an etchant there can be used, for example, hydrofluoric acid (an aqueous solution of hydrogen fluoride (HF)). Alternatively, sulfuric acid ($H_2SO_4$), an aqueous solution of sulfuric acid, nitric acid ($HNO_3$), an aqueous solution of nitric acid, or hydrochloric acid (an aqueous solution of hydrogen chloride (HCl)) may be used. A mixture of these acids may also be used as the etchant. When hydrofluoric acid is used as the etchant, the etching of the modified portions formed in the glass sheet 10 readily proceeds, and thus the through holes 11 can be quickly formed. When sulfuric acid is used as the etchant, the glass in the areas other than the modified portions formed in the glass sheet 10 is slow to be etched, and thus the through holes 11 can be formed as straight holes with a narrow cone angle.

The etching time and the temperature of the etchant are selected as appropriate depending on the shape and size of the modified portions formed in the glass sheet 10. The etching rate can be enhanced by increasing the temperature of the etchant used for the etching. The diameter of the through holes 11 can be controlled by adjusting the etching conditions.

For example, when the modified portions are formed to be exposed to the outside at the upper and lower surfaces of the glass sheet 10 in the step (I-a), the through holes 11 can be formed by etching the glass sheet 10 from its upper and lower surfaces. When the modified portions are formed so as not to be exposed at the upper or lower surface of the glass sheet 10 in the step (I-a), the glass sheet 10 may be ground to expose the modified portions to the outside before the step (I-b).

The through holes 11 can be formed in a cylindrical shape, frusto-conical shape, one-sheet hyperboloidal shape (hourglass shape), or the like, by adjusting the conditions employed for the formation of the modified portions in the step (I-a) and the conditions employed for the etching in the step (I-b).

Next, the step (II) will be described. First, a resin composition sensitive to light having the predetermined wavelength $\lambda_1$ within the wavelength range of 120 nm to 300 nm is prepared. As such a resin composition there can be used, for example, a resin composition whose solubility in a predetermined alkaline solution can be increased by irradiating the resin composition with light having the wavelength $\lambda_1$. In other words, this resin composition is insoluble in the predetermined alkaline solution before being photoexposed. For example, a resin composition for use as a chemically amplified positive photoresist can be employed in the step (II). Such a chemically amplified positive photoresist contains, for example: an alkali-soluble resin having an alkali-soluble group protected by an acid-labile protecting group; and a photo-acid generator. The resin layer 20 can be formed as shown in (e) of FIG. 1, for example, by applying such a resin composition over the entirety of the first principal surface of the glass sheet 10 using a coating technique such as spin coating. In this case, the application of the resin composition to the glass sheet 10 results in the formation of the resin layer 20 covering the through holes 11.

Alternatively, the resin layer 20 may be formed by attaching to the first principal surface of the glass sheet 10 a dry film containing the resin composition sensitive to light having the wavelength $\lambda_1$. The attachment of such a dry film to the first principal surface of the glass sheet 10 can be accomplished, for example, by hot press.

Next, the step (III) will be described. In the step (III), the glass sheet 10 and resin layer 20 are irradiated with the light U having the wavelength $\lambda_1$ and applied from the direction of the second principal surface of the glass sheet 10 (the principal surface of the glass sheet 10 opposite to the first principal surface having the resin layer 20 formed thereon) as shown in (f) of FIG. 1. The light U with which the glass sheet 10 and resin layer 20 are irradiated may further have a different wavelength from the wavelength $\lambda_1$. In this case, the spectrum of the light with which the glass sheet 10 and resin layer 20 are irradiated preferably has a peak at around the wavelength $\lambda_1$. Most of the light having the wavelength $\lambda_1$ does not pass through the glass sheet 10, since the light transmittance of the glass sheet 10 at the wavelength $\lambda_1$ is 1% or less as previously described. The glass sheet 10 protects the resin layer 20 from the light U so as to prevent the resin layer 20 from being photoexposed by beams of the light U that are incident on the second principal surface of the glass sheet 10 in the step (III). The areas of the resin layer 20 that are in contact with the glass sheet 10 are thus not photoexposed by the light U. The light U passing through the through holes 11 reach the areas of the resin layer 20 that cover the through holes 11 (areas facing the through holes 11), thereby photoexposing those areas. The light U, whose wavelength is in the ultraviolet region, causes, for example, the photo-acid generator to undergo photolysis leading to generation of an acid, followed by a deprotection reaction in which the acid-labile protecting group is removed by the action of the acid serving as a catalyst. The polarity of the resin is consequently changed so that the photoexposed areas of the resin layer 20 change from being alkali-insoluble to being alkali-soluble. The areas of the resin layer 20 that cover the through holes 11 come to have an increased solubility in a predetermined alkaline solution, while the other areas of the resin layer 20 remain insoluble in the predetermined alkaline solution.

The source of the light U is not particularly limited, as long as the light emitted from the source has the predetermined wavelength $\lambda_1$ within the range of 120 nm to 300 nm. As the source of the light U there can be used, for example, an excimer laser, excimer lamp, or low-pressure mercury lamp. The excimer laser emits light having a wavelength of, for example, 193 nm (ArF) or 248 nm (KrF). The excimer lamp emits light having a wavelength of, for example, 126 nm ($Ar_2$), 146 nm ($Kr_2$), 172 nm ($Xe_2$), or 222 nm (KrCl). The low-pressure mercury lamp emits light having a wavelength of, for example, 185 nm or 254 nm. The abovementioned harmonic beams such as those from a Nd:YAG laser can also be used. Depending on the situation, a filter that limits the wavelength of the emitted light to the range of 120 nm to 300 nm may additionally be used. The time of irradiation with the light U is not particularly limited, as long as the areas of the resin layer 20 that cover the through holes 11 can be sufficiently photoexposed. The time of irradiation with the light U is, for example, several seconds to several minutes.

Next, the step (IV) will be described. In the step (IV), the areas of the resin layer 20 that have been photoexposed in the step (III) are removed. For example, the resin layer 20 is dipped in the predetermined alkaline solution. This removes the areas of the resin layer 20 that cover the through holes 11, resulting in the formation of the through-resin holes 21 as shown in (g) of FIG. 1. In the foregoing manner, a glass substrate 1a is produced.

As the predetermined alkaline solution there can be used, for example, a developer for positive photoresists. For example, a solution containing tetramethylammonium hydroxide (TMAH) can be used as the predetermined alkaline solution. The areas of the resin layer 20 other than those covering the through holes 11, which have not been photoexposed by the light U, are insoluble in the predetermined alkaline solution and remain unremoved.

The areas of the resin layer 20 that have been photoexposed in the step (III) lie directly above the through holes 11. Thus, the step (IV) results in the formation of the through-resin holes 21 aligned exactly with the through holes 11. That is, the through-resin holes 21 are formed to extend from the through holes 11 in the thickness direction of the resin layer 20. As seen from the foregoing description, the glass sheet 10 having the through holes 11 formed therein functions as a mask for forming the through-resin holes 21 at predetermined positions in the resin layer 20.

The method for producing a glass substrate according to the first embodiment may further include a step (V). The step (V) is a step of forming through glass vias 30 inside the through holes 11 and inside the through-resin holes 21. The method for forming the through glass vias 30 is not particularly limited, as long as the through glass vias 30 can be formed inside the through holes 11 and inside the through-resin holes 21. For example, the formation of the through glass vias 30 inside the through holes 11 is accomplished by plating using a metal such as Cu (copper). Direct plating on the glass sheet 10 is difficult. Thus, for example, seed layers 12, on which a conductive material for forming the through glass vias 30 is to be deposited, are formed at least on the inner peripheral surfaces of the through holes 11 as shown in (c) of FIG. 1, and then the through glass vias 30 are formed by plating. The formation of the seed layers 12 can be accomplished by bringing a catalyst containing, for example, Pd (palladium) into contact with the surfaces, including the inner peripheral surfaces of the through holes 11, of the glass sheet 10. In this manner, the glass sheet 10 can be electroless-plated. In the method for producing a glass substrate according to the first embodiment, the seed layers 12 that have been formed on the first principal surface of the glass sheet 10 on which the resin layer 20 is to be formed are removed as shown in (d) of FIG. 1 by grinding. This prevents electrical conduction between the through glass vias 30. As shown in FIG. 1, the formation and removal of the seed layers 12 are performed, for example, after the step (I) and before the step (II).

The metal for plating the glass sheet 10 is not particularly limited. The metal is preferably Cu (copper) in terms of increasing the electrical conductivity and reducing the production cost. The following will describe an example where Cu (copper) is used for the plating. First, plating layers are formed from Cu (copper) deposited by electroless plating on the seed layers 12 formed on the inner peripheral surfaces of the through holes 11. Cu (copper) is further deposited on the surfaces of the plating layers to allow the plating layers to grow so that the through glass vias 30 are formed inside the through holes 11 and inside the through-resin holes 21 as shown in (h) of FIG. 1. When the seed layers 12 lie on the second principal surface of the glass sheet 10, Cu (copper) is deposited also on the second principal surface of the glass sheet 10 to form a plating layer on the second principal surface. When a plating layer with a certain thickness is formed on the second principal surface of the glass sheet 10 by the electroless plating, electrical conductivity is provided to the second principal surface of the glass sheet 10. In this case, electrolytic plating may be performed to accomplish efficient plating. That is, the glass sheet 10 may be plated by a combination of electroless plating and electrolytic plating.

When a plating layer is formed on the second principal surface of the glass sheet 10, this plating layer may be removed by grinding. In this case, the seed layers 12 are also removed together with the plating layer. As a result, a glass substrate lax as shown in (i) of FIG. 1 is produced. Alternatively, the plating layer may be used for forming a predetermined circuit pattern on the second principal surface of the glass sheet 10 by photolithography.

Second Embodiment

Next, the method for producing a glass substrate according to the second embodiment will be described. The method for producing a glass substrate according to the second embodiment is performed in the same manner as the method for producing a glass substrate according to the first embodiment, unless otherwise described. The description given for the first embodiment is applicable to the second embodiment, unless there is a technical inconsistency.

In the method for producing a glass substrate according to the second embodiment, the steps (I), (III), and (IV) are performed in the same manner as those in the first embodiment. The seed layers 12 are also formed in the same manner as those in the first embodiment.

Figure 2:
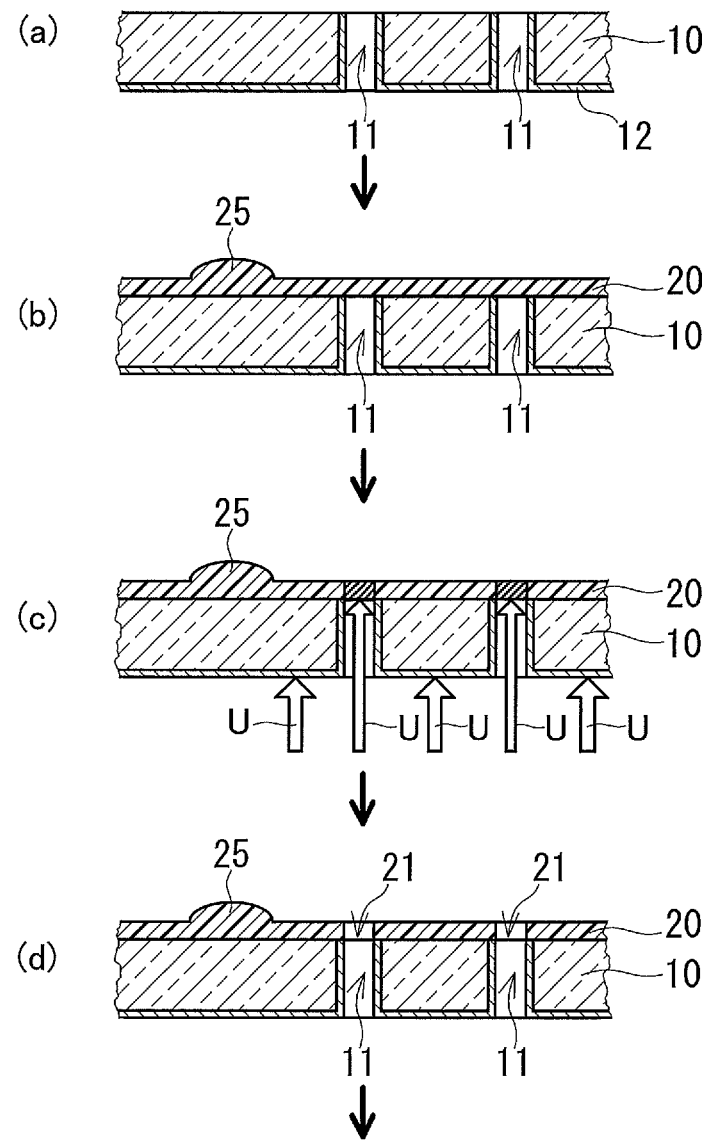
FIG. 2 shows cross-sectional views illustrating some of the steps of the method for producing a glass substrate according to the second embodiment.

In the step (II) of the method for producing a glass substrate according to the second embodiment, an optical element 25 is on the first principal surface of the glass sheet 10 at a predetermined distance from the through hole 11 as shown in (b) of FIG. 2. In this step, a positive-type ultraviolet-sensitive resin composition can be used as the resin composition for forming the resin layer 20. This resin composition is sensitive to light having the predetermined wavelength $\lambda_1$ within the wavelength range of 120 nm to 300 nm. The optical element 25 is, for example, a lens having a predetermined curved surface. The optical element 25 is formed at a predetermined position in the resin layer 20 by a molding technique such as thermal imprinting using a mold with a desired shape. The through hole 11 can be used as a guide for determining the position where the optical element 25 is to be formed. This allows the position where the optical element 25 is actually formed to accurately coincide with the position where the optical element 25 should be formed. The position where the optical element 25 should be formed is determined so that, for example, when the glass substrate produced is stacked on another substrate including an optical device such as a light-receiving element or light-emitting element, a predetermined positional relationship is established between the optical device included in the other substrate and the optical element 25. For example, the position of the optical element 25 is determined so that when the glass substrate produced is stacked on another substrate including an optical device, the optical element 25 is positioned on the path of light emitted from the optical device or light received by the optical device.

As shown in (c) of FIG. 2, the areas of the resin layer 20 that cover the through holes 11 are photoexposed by irradiating the areas with the light U applied from the direction of the second principal surface of the glass sheet 10. After that, as shown in (d) of FIG. 2, the predetermined alkaline solution is brought into contact with the photoexposed areas of the resin layer 20 to remove the photoexposed areas of the resin layer 20 and thereby form the through-resin holes 21 extending through the resin layer 20.

The method for producing a glass substrate according to the second embodiment may include the step (V), similarly to the method according to the first embodiment. The step (V) is a step of forming the through glass vias 30 inside the through holes 11 and inside the through-resin holes 21. As previously described, the seed layers 12, on which a conductive material such as Cu (copper) for forming the through glass vias 30 is to be deposited, are formed on the surfaces of the glass sheet 10. This allows the through glass vias 30 to be formed by plating inside the through holes 11 and inside the through-resin holes 21 as shown in (e) of FIG. 3.

The seed layers 12 are formed on the principal surface of the glass sheet 10 remote from the resin layer 20; thus, a plating layer is formed also on this principal surface. In an example of the method for producing a glass substrate according to the second embodiment, the plating layer is removed as shown in (0 of FIG. 3, for example, by grinding. The grinding removes not only the plating layer but also the seed layers 12. In this case, conductive portions 40a electrically connected to the through glass vias 30 can be formed on the principal surface of the glass sheet 10 remote from the resin layer 20, as shown in (g) of FIG. 3. The formation of the conductive portions 40a can be accomplished, for example, by sputtering or vapor-depositing a conductive material such as Cu (copper) for forming the conductive portions 40a onto the principal surface of the glass sheet 10 remote from the resin layer 20, with this principal surface being masked except for the areas where the conductive portions 40a are to be formed. In this manner, a glass substrate 1b as shown in (g) of FIG. 3 which includes the through glass vias 30 and conductive portions 40a is produced.

Figure 3:
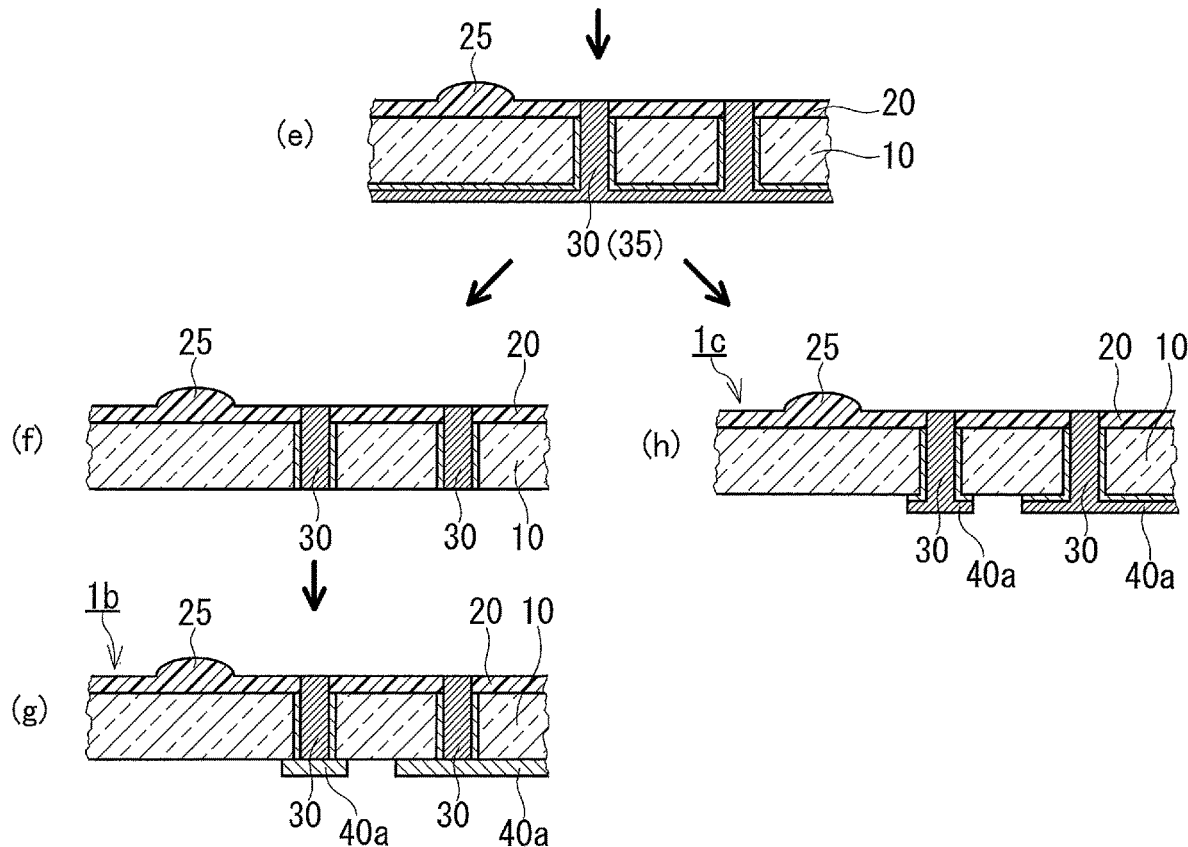
FIG. 3 shows cross-sectional views illustrating the steps following those of FIG. 2 in the method for producing a glass substrate.

In another example of the method for producing a glass substrate according to the second embodiment, the conductive portions 40a can be formed, as shown in (h) of FIG. 3, by performing photolithography on the plating layer formed on the principal surface of the glass sheet 10 remote from the resin layer 20 in such a manner as to allow necessary areas of the plating layer to remain. This photolithography removes not only unnecessary areas of the plating layer but also the seed layers 12. In this manner, a glass substrate 1c as shown in (h) of FIG. 3 which includes the through glass vias 30 and conductive portions 40a is produced.

Figure 4:
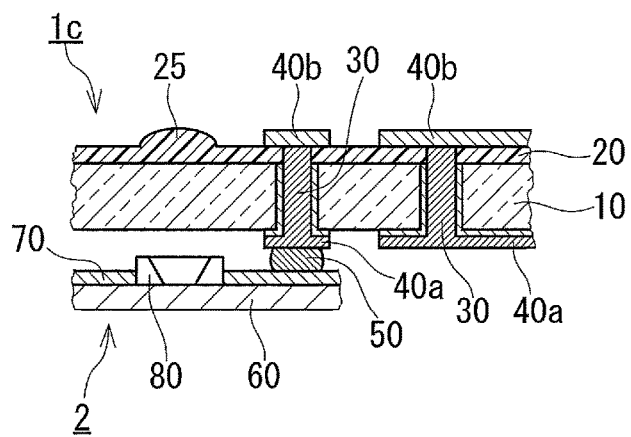
FIG. 4 is a cross-sectional view illustrating an example of the use of a glass substrate produced by the production method according to the second embodiment.

Examples of the use of the glass substrate 1b or glass substrate 1c will now be described. The glass substrate 1b or glass substrate 1c is used, for example, by being stacked on an optical device substrate 2 as shown in FIG. 4. The optical device substrate 2 includes a substrate 60, a conductive portion 70, and an optical device 80. The optical device 80 is a light-emitting element such as a light-emitting diode (LED) or vertical cavity surface emitting laser (VCSEL) or is a light-receiving element such as an avalanche photodiode (APD). The conductive portion 70 is a circuit pattern formed on the substrate 60 and is electrically connected to the optical device 80. The joining of the glass substrate 1b or glass substrate 1c to the optical device substrate 2 is accomplished by a solder bump 50. Specifically, the optical device substrate 2 is placed close to the conductive portion 40a, and then the conductive portion 40a and the conductive portion 70 are joined by the solder bump 50.

The optical element 25 is accurately positioned with respect to the through hole 11, as previously described. This also allows accurate positioning between the optical element 25 and the optical device 80. For example, the positioning between the glass substrate 1b or glass substrate 1c and the optical device substrate 2 can be accomplished by using the through glass via 30 as a guide. The glass substrate 1b or glass substrate 1c is stacked on the optical device substrate 2 in such a manner that the optical element 25 is located at a predetermined position. For example, the optical element 25 is positioned on the path of light emitted from the optical device 80 or light to be received by the optical device 80. The optical axis of the optical element 25 and the optical axis of the optical device 80 can be made to coincide with each other, since the positioning between the optical element 25 and the optical device 80 can be done using the through hole 11 or through glass via 30 as a guide. The optical element 25, resin layer 20, and glass sheet 10 permit passage of light emitted from the optical device 80 or light to be received by the optical device 80.

Conductive portions 40b electrically connected to the through glass vias 30 are formed on the resin layer 20 of the glass substrate 1b or on the resin layer 20 of the glass substrate 1c, if necessary. In this case, an electrical power, modulation signal, or the like, can be input to the optical device 80 from the outside of the optical device substrate 2 through the conductive portion 40b, through glass via 30, conductive portion 40a, and conductive portion 70. Additionally, since the optical element 25 and the optical device 80 are respectively provided on different substrates, it is easy, when the resulting product is defective, to find which of the glass substrate 1b or 1c and the optical device substrate 2 has a defect.

A controller (not shown) for controlling the optical device 80 may be provided to the side of the glass substrate 1b or glass substrate 1c on which the resin layer 20 lies. In this case, the controller is electrically connected to the optical device 80 through the conductive portion 40b, through glass via 30, conductive portion 40a, and conductive portion 70. In other words, the controller for controlling the optical device 80 can be mounted on a substrate other than a substrate on which the optical device 80 is provided. Circuits or elements can be arranged in a direction perpendicular to the principal surfaces of substrates as described above, and this allows a module to have a high integration density.

Third Embodiment

Next, the method for producing a glass substrate according to the third embodiment will be described. The method for producing a glass substrate according to the third embodiment is performed in the same manner as the method for producing a glass substrate according to the first embodiment, unless otherwise described. The description given for the first embodiment is applicable to the third embodiment, unless there is a technical inconsistency.

The method for producing a glass substrate according to the third embodiment includes the steps (I), (II), (III), and (IV) and further includes the step (V), similarly to the method according to the first embodiment. The step (V) is a step of forming the through glass vias 30 inside the through holes 11 and inside the through-resin holes 21. In the step (V), for example, the seed layers 12, on which a conductive material for forming the through glass vias 30 is to be deposited, are formed at least on the inner peripheral surfaces of the through holes 11, and then the through glass vias 30 are formed by plating. In this example, as shown in (a) of FIG. 5, the seed layers 12 are formed all over the glass sheet 10 except for the surface on which the resin layer 20 lies. In this case, the plating results not only in the formation of the through glass vias 30 but also in the formation of a plating layer on the principal surface of the glass sheet 10 remote from the resin layer 20, as shown in (b) of FIG. 5. The plating layer is not formed on the surface of the resin layer 20 due to the seed layer 12 not being formed on the resin layer 20.

Figure 5:
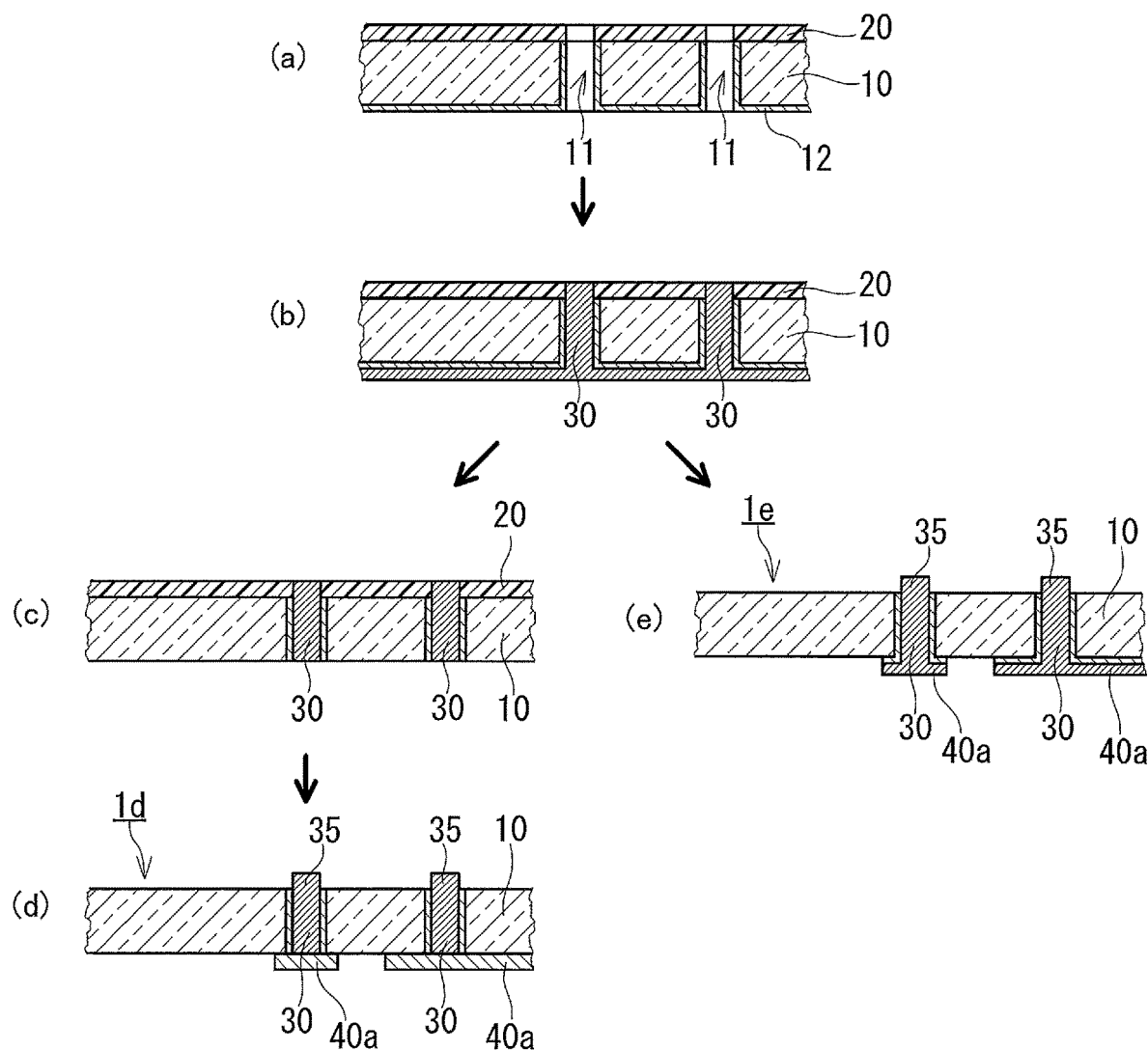
FIG. 5 shows cross-sectional views illustrating the steps of the method for producing a glass substrate according to the third embodiment.

The plating layer formed on the principal surface of the glass sheet 10 remote from the resin layer 20 is removed as shown in (c) of FIG. 5, for example, by grinding. The grinding removes not only the plating layer but also the seed layers 12. In this case, the conductive portions 40a are subsequently formed to be electrically connected to the through glass vias 30. The formation of the conductive portions 40a can be accomplished, for example, by sputtering or vapor-depositing a conductive material such as Cu (copper) for forming the conductive portions 40a onto the principal surface of the glass sheet 10 remote from the resin layer 20, with this principal surface being masked except for the areas where the conductive portions 40a are to be formed.

The plating layer formed on the principal surface of the glass sheet 10 remote from the resin layer 20 may be allowed to remain unremoved and be used to form the conductive portions 40a. For example, the conductive portions 40a can be formed, as shown in (e) of FIG. 5, by performing photolithography on the plating layer formed on the principal surface of the glass sheet 10 remote from the resin layer 20 in such a manner as to allow necessary areas of the plating layer to remain. This photolithography removes not only unnecessary areas of the plating layer but also the seed layers 12.

The method for producing a glass substrate according to the third embodiment further includes a step (VI). The step (VI) is a step of removing the resin layer 20 to make bare a portion of each through glass via 30 after the step (V), the portion lying inside the through-resin hole 21 and being surrounded by the resin layer 20 before the removal of the resin layer 20. The method for removing the resin layer 20 is not particularly limited. For example, the resin layer 20 is removed by irradiating the resin layer 20 with the light U having the predetermined wavelength $\lambda_1$ within the wavelength range of 120 nm to 300 nm to photoexpose the entire resin layer 20 and then by bringing the predetermined alkaline solution into contact with the resin layer 20. For example, when the conductive portions 40a are formed by photolithography on the plating layer formed on the principal surface of the glass sheet 10 remote from the resin layer 20, the developer for the photolithography can be used not only to develop the resist layer formed on the plating layer but also to simultaneously remove the resin layer 20. In the foregoing manner, a glass substrate 1d shown in (d) of FIG. 5 or glass substrate 1e shown in (e) of FIG. 5 can be produced. Each of the glass substrates 1d and 1e includes the through glass vias 30 and conductive portions 40a, and a portion of each through glass via 30 projects from the principal surface of the glass sheet 10 remote from the conductive portions 40a.

Figure 6:
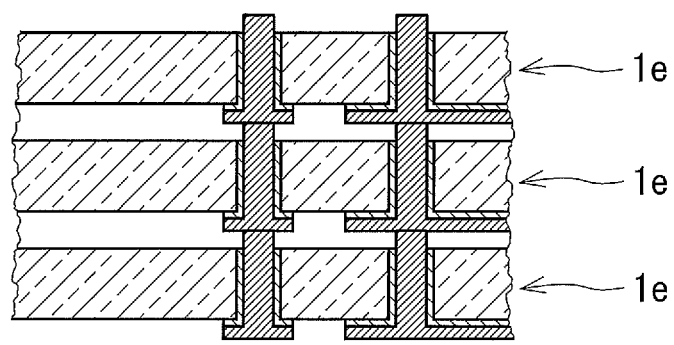
FIG. 6 is a cross-sectional view illustrating an example of the use of a glass substrate produced by the production method according to the third embodiment.

The bare portion of each through glass via 30 that projects from the principal surface of the glass sheet 10 remote from the conductive portions 40a is a pillar 35 functioning as a base for electrical connection of the glass substrate 1d or glass substrate 1e. With the method for producing a glass substrate according to the third embodiment, the pillar 35 functioning as a base for electrical connection can easily be formed. When a plurality of the glass substrates 1e are stacked on top of each other as shown in FIG. 6, the electrical connection between the elements is established via the pillars 35. This allows a circuit pattern or wiring to have a high integration density.

The invention claimed is:

1. A substrate comprising,
   a glass sheet that has a light transmittance of 1% or less at a wavelength $\lambda_1$ within a wavelength range of 120 nm to 300 nm, the glass sheet having a first through hole;
   a resin layer that is formed on a first principal surface of the glass sheet and is sensitive to light having the wavelength $\lambda_1$, the resin layer having a second through hole that is aligned with the first through hole; and
   a through-glass via that is formed inside the first through hole and the second through hole, wherein
   the resin layer is capable of changing from being alkali-insoluble to being alkali-soluble by exposure to the light.

2. The substrate according to claim 1, wherein the glass sheet has a light absorption coefficient of 50 cm$^{-1}$ or less at a wavelength $\lambda_2$ within a wavelength range of 250 nm to 535 nm.

3. The substrate according to claim 2, wherein the wavelength $\lambda_1$ is shorter than the wavelength $\lambda_2$.

4. The substrate according to claim 1, wherein the through-glass via has a bare portion adjacent to a surface of the resin layer.

5. The substrate according to claim 1, wherein the resin layer is formed of a resin composition of a positive photoresist.

6. The substrate according to claim 1, wherein the through-glass via contains copper.

7. The substrate according to claim 1, further comprising a conduct portion that is formed on a principle surface of the substrate at a position corresponding to the through-glass via.

8. The substrate according to claim 1, further comprising an optical element that is disposed at a side of the resin layer of the substrate at a predetermined distance from the second through hole.

9. The substrate according to claim 8, wherein the resin layer comprises the optical element.

10. An assembly comprising, the substrate according to claim 8; and
    an optical device that is disposed so that the optical element of the substrate is positioned on a path of light emitted from the optical device or light received by the optical device.

11. The substrate according to claim 1, wherein the wavelength $\lambda_1$ is from 120 nm to 254 nm.

* * * * *